(12) United States Patent
Wang et al.

(10) Patent No.: US 8,236,465 B2
(45) Date of Patent: Aug. 7, 2012

(54) METHOD FOR MANUFACTURING FLEXIBLE COLOR FILTER SUBSTRATE

(75) Inventors: Yi-Ching Wang, Hsinchu (TW); Chien-Jung Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/112,470

(22) Filed: May 20, 2011

(65) Prior Publication Data

US 2012/0082925 A1    Apr. 5, 2012

(30) Foreign Application Priority Data

Oct. 5, 2010  (TW) ................................ 99133904 A

(51) Int. Cl.
*G02B 5/20* (2006.01)
(52) U.S. Cl. ............................. 430/7; 427/162; 427/165
(58) Field of Classification Search ........................ None
See application file for complete search history.

(56) References Cited

U.S. PATENT DOCUMENTS

2007/0059854 A1*  3/2007  Huang et al. .................... 438/30
2010/0178832 A1*  7/2010  Liu et al. .......................... 445/24
2010/0323576 A1*  12/2010 Hsiao et al. ..................... 445/24

FOREIGN PATENT DOCUMENTS

JP         8-248219 A    *    9/1996

OTHER PUBLICATIONS

Computer-generated translation of JP 8-248219 A (Sep. 1996).*

* cited by examiner

*Primary Examiner* — John A. McPherson
(74) *Attorney, Agent, or Firm* — WPAT, PC; Justin King

(57) ABSTRACT

A method for manufacturing flexible color filter substrate includes the following steps. First, a rigid substrate is provided. The rigid substrate has an upper surface and a lower surface opposite to the upper surface. The upper surface includes a first region and a second region located at a periphery of the first region. Next, a release layer is formed on the first region. Next, a flexible substrate layer is formed to cover the second region and the release layer. Next, a color photoresist layer is formed on a portion of the flexible substrate layer above the release layer. Next, the rigid substrate and the flexible substrate layer are cut along a border between the first region and the second region. Next, the flexible substrate layer is separated with the release layer. The method for manufacturing flexible color filter substrate can improve optical performance of the flexible color filter substrate.

7 Claims, 3 Drawing Sheets

METHOD FOR MANUFACTURING FLEXIBLE COLOR FILTER SUBSTRATE

BACKGROUND

1. Technical Field

The present invention generally relates to a method for manufacturing color filter substrate and, particularly to a method for manufacturing flexible color filter substrate.

2. Description of the Related Art

Recently, along with the progress of the science and technology and the development of the society, display devices are widely used in various electronic devices. Moreover, because of the rapid development of the electronic devices, which become more and more light, thin, short, and small, and are easy to carry, a flexible display device also appears in the market.

To make the flexible display device can display color images, a common method is to use a flexible color filter substrate. The flexible color filter substrate includes a flexible substrate and a color photoresist layer formed on the flexible substrate.

The conventional method for manufacturing a flexible color filter substrate is as follows. First, a transparent polyimide layer is formed on a rigid substrate. Next, a color photoresist layer is formed on the polyimide layer. Then, the polyimide layer and the color photoresist layer are separated with the rigid substrate.

The conventional method for separating the rigid substrate with the polyimide layer usually uses a laser lift-off process. However, the polyimide layer irradiated by laser light is easy to become yellow, so as to reduce transmittance of the flexible color filter substrate.

BRIEF SUMMARY

Accordingly, the present invention is directed to a method for manufacturing flexible color filter substrate, which can improve optical performance of the flexible color filter substrate.

A method for manufacturing flexible color filter substrate in accordance with an embodiment of the present invention includes the following steps. First, a rigid substrate is provided. The rigid substrate has an upper surface and a lower surface opposite to the upper surface. The upper surface includes a first region and a second region located at a periphery of the first region. Next, a release layer is formed on the first region. Next, a flexible substrate layer is formed to cover the second region and the release layer. Next, a color photoresist layer is formed on a portion of the flexible substrate layer above the release layer. Next, the rigid substrate and the flexible substrate layer are cut along a border between the first region and the second region. Next, the flexible substrate layer is separated with the release layer.

In one embodiment of the present invention, the rigid substrate is a transparent glass substrate.

In one embodiment of the present invention, the rigid substrate is a quartz glass substrate.

In one embodiment of the present invention, material of the release layer includes styrene, maleic anhydride copolymer, or silicone.

In one embodiment of the present invention, the flexible substrate layer is a thin glass substrate layer or a plastic substrate layer.

In one embodiment of the present invention, material of the flexible substrate layer includes polyethylene terephthalate, polyethylene naphthalate, polyamide, polyimide, polycycloolefin, polysulfone, epoxy, polycarbonate, or polymethylmethacrylate.

In one embodiment of the present invention, a method for cutting the rigid substrate and the flexible substrate layer is laser cutting.

In summary, in the method for manufacturing flexible color filter substrate of the present invention, because the release layer is formed between the rigid substrate and the flexible substrate layer, the laser lift-off process need not be used to separate the rigid substrate with the flexible substrate layer. Thus, the flexible substrate layer will not be irradiated by the laser light, and the flexible substrate layer can be avoided from becoming yellow. Therefore, optical performance of the flexible color filter substrate can be improved.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Accordingly, the descriptions will be regarded as illustrative in nature and not as restrictive.

Figure 1A:
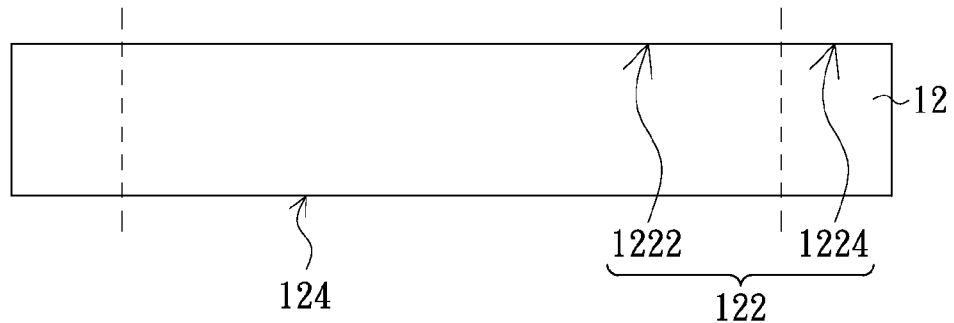
FIGS. 1A to 1F are schematic flow charts of a method for manufacturing flexible color filter substrate in accordance with an exemplary embodiment.

FIGS. 1A to 1F are schematic flow charts of a method for manufacturing flexible color filter substrate in accordance with an exemplary embodiment of the present invention. Referring to FIG. 1A, the method for manufacturing a flexible color filter substrate is to provide a rigid substrate 12 firstly. The rigid substrate 12 may be a transparent glass substrate, such as a quartz glass substrate. The rigid substrate 12 has an upper surface 122 and a lower surface 124 opposite to the upper surface 122. The upper surface 122 includes a first region 1222 and a second region 1224 located at a periphery of the first region 1222.

Figure 1B:
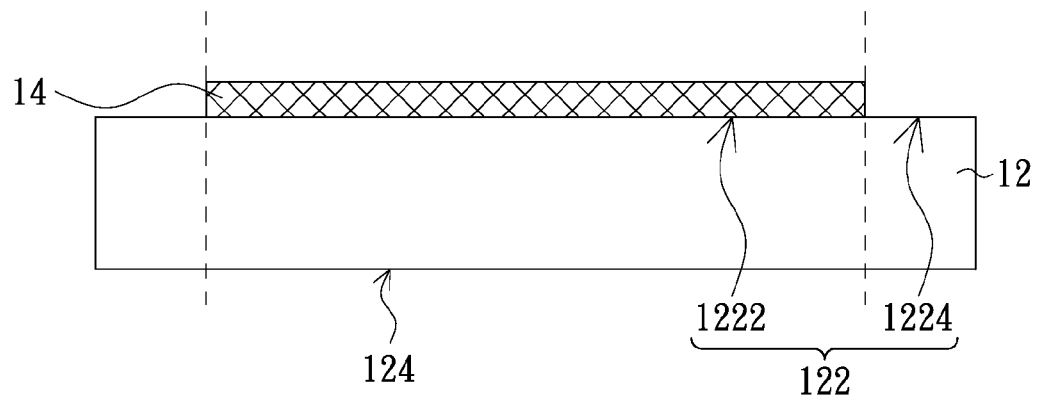

Then, referring to FIG. 1B, a release layer 14 is formed on the first region 1222 of the upper surface 122. Material of the release layer 14 may include styrene, maleic anhydride copolymer, or silicone, but material of the release layer 14 is not limited to the above-mentioned material.

Figure 1C:
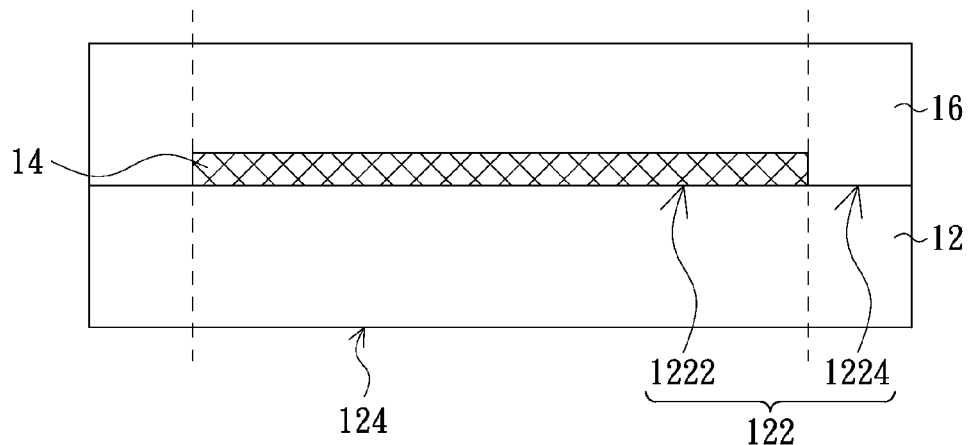

Referring to FIG. 1C, after forming the release layer 14, a flexible substrate layer 16 is formed. The flexible substrate layer 16 covers the second region 1224 and the release layer 14. The flexible substrate layer 16 may be a thin glass substrate layer or a plastic substrate layer, but material of the flexible substrate layer 16 is not limited to the above-mentioned material. In detail, when the material of the flexible substrate layer 16 is plastic, it may include polyethylene terephthalate, polyethylene naphthalate, polyamide, polyimide, polycycloolefin, polysulfone, epoxy, polycarbonate, or polymethylmethacrylate.

Figure 1D:
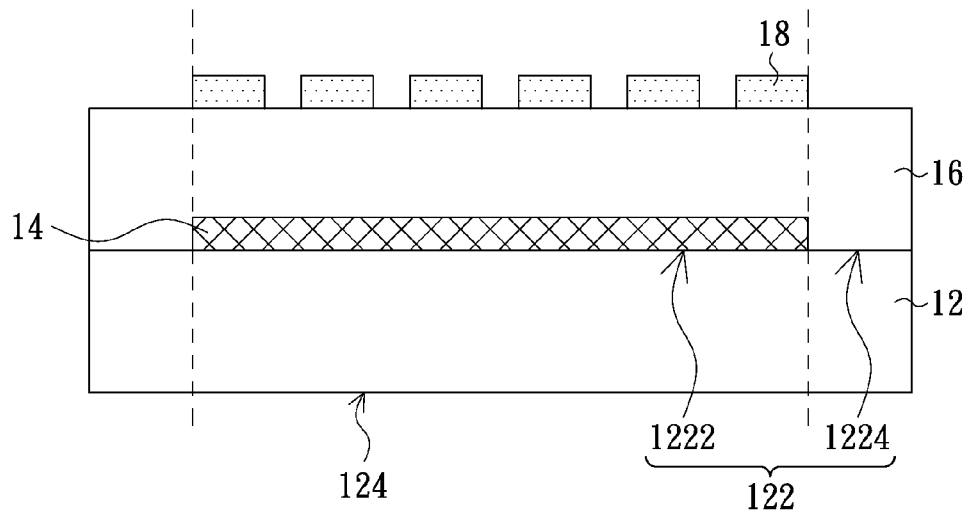

Referring to FIG. 1D, after forming the flexible substrate layer 16, a color photoresist layer 18 is formed. The color photoresist layer 18 is formed on a portion of the flexible substrate layer 16 above the release layer 14. In other words, the color photoresist layer 18 is formed above the first region 1222. In addition, the color photoresist layer 18 includes many color photoresists arranged in array and a black matrix for separating the color photoresists.

Figure 1E:
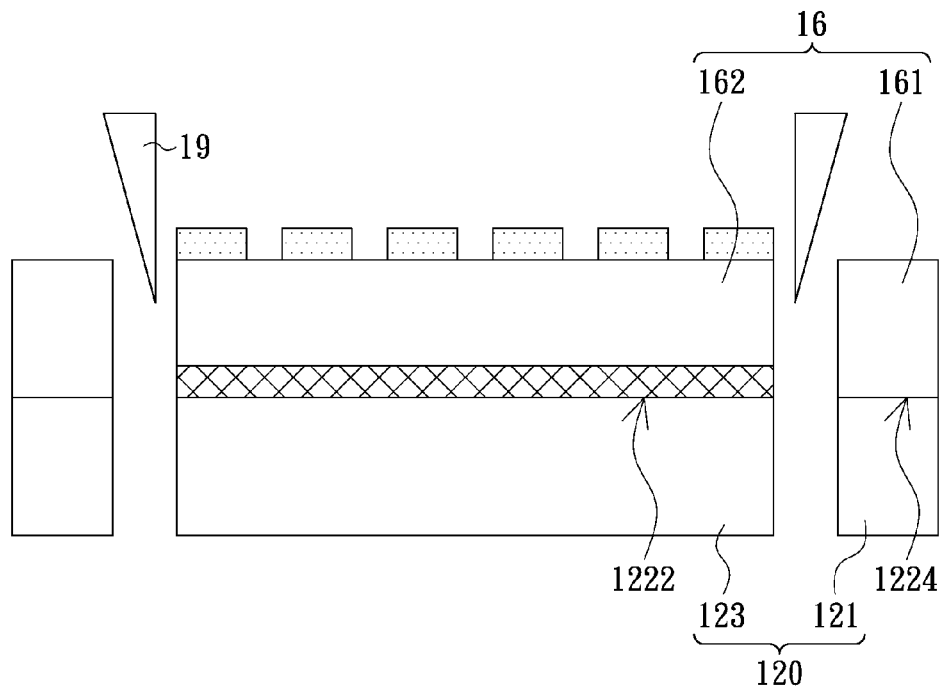

Referring to FIG. 1E, after forming the color photoresist layer 18, the rigid substrate 12 and the flexible substrate layer 16 are cut along a border between the first region 1222 and the second region 1224. A method for cutting the rigid substrate 12 and the flexible substrate layer 16 may be laser cutting. In detail, the method for cutting the rigid substrate 12 and the flexible substrate layer 16 may use a laser beam 19 to cut the border between the first region 1222 and the second region 1224, and thus a part of the rigid substrate 121 and a part of the flexible substrate layer 161 are removed. That is, the rigid substrate 12 is cut into a rigid substrate 121 including the second region 1224 and a rigid substrate 123 including the first region 1222. The flexible substrate layer 16 is cut into a flexible substrate layer 161 above the second region 1224 and a flexible substrate layer 162 above the first region 1222.

Figure 1F:
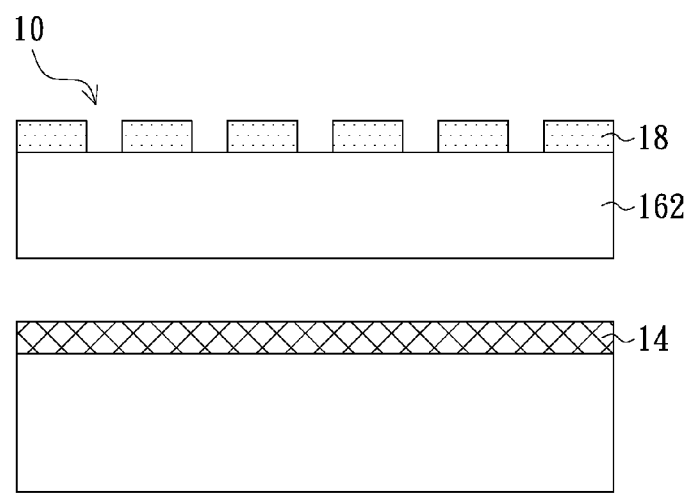

Referring to FIG. 1F, after cutting the rigid substrate 12 and the flexible substrate layer 16, the flexible substrate layer 162 is separated with the release layer 14 to make the flexible substrate layer 162 and the color photoresist layer 18 are separated from the rigid substrate 12, thus forming a flexible color filter substrate 10.

In the present embodiment, as the release layer 14 is formed between the rigid substrate 12 and the flexible substrate layer 162, the flexible substrate layer 162 can be easily separated from the rigid substrate 12 through the release layer 14. So, the laser lift-off process used in conventional technology can be omitted. Thus, the flexible substrate layer 162 will not be irradiated by the laser light, and the flexible substrate layer 162 can be avoided from becoming yellow. Therefore, the method for manufacturing the flexible color filter substrate of the present embodiment can improve optical performance and optical stability of the flexible color filter substrate.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for manufacturing flexible color filter substrate, comprising:
   providing a rigid substrate having an upper surface and a lower surface opposite to the upper surface, the upper surface comprising a first region and a second region located at a periphery of the first region;
   forming a release layer on the first region;
   forming a flexible substrate layer to cover the second region and the release layer;
   forming a color photoresist layer on a portion of the flexible substrate layer above the release layer;
   cutting the rigid substrate and the flexible substrate layer along a border between the first region and the second region; and
   separating the release layer with the flexible substrate layer.

2. The method as claimed in claim 1, wherein the rigid substrate is a transparent glass substrate.

3. The method as claimed in claim 2, wherein the rigid substrate is a quartz glass substrate.

4. The method as claimed in claim 1, wherein material of the release layer comprises styrene, maleic anhydride copolymer, or silicone.

5. The method as claimed in claim 1, wherein the flexible substrate layer is a thin glass substrate layer or a plastic substrate layer.

6. The method as claimed in claim 1, wherein material of the flexible substrate layer comprises polyethylene terephthalate, polyethylene naphthalate, polyamide, polyimide, polycycloolefin, polysulfone, epoxy, polycarbonate, or polymethylmethacrylate.

7. The method as claimed in claim 1, wherein a method for cutting the rigid substrate and the flexible substrate layer is laser cutting.

* * * * *